United States Patent
Hauptmann et al.

(10) Patent No.: US 8,259,821 B2
(45) Date of Patent: *Sep. 4, 2012

(54) XDSL MULTISTANDARD DRIVER CIRCUIT

(75) Inventors: Jorg Hauptmann, Wernberg (AT);
Markus Terschluse, Neubiberg (DE)

(73) Assignee: Lantiq Deutschland GmbH, Neubiberg (DE)

( * ) Notice: Subject to any disclaimer, the term of this patent is extended or adjusted under 35 U.S.C. 154(b) by 203 days.

This patent is subject to a terminal disclaimer.

(21) Appl. No.: 12/650,824

(22) Filed: Dec. 31, 2009

(65) Prior Publication Data

US 2010/0104089 A1    Apr. 29, 2010

Related U.S. Application Data

(63) Continuation of application No. 11/199,637, filed on Aug. 9, 2005, now Pat. No. 7,649,948.

(30) Foreign Application Priority Data

Aug. 11, 2004  (DE) .......................... 10 2004 039 022

(51) Int. Cl.
  *H04B 3/00*  (2006.01)
(52) U.S. Cl. .......................... 375/257; 375/222; 375/219
(58) Field of Classification Search .................. 375/257, 375/222, 219
See application file for complete search history.

(56) References Cited

U.S. PATENT DOCUMENTS

| | | | | |
|---|---|---|---|---|
| 6,028,486 | A * | 2/2000 | Andre | 330/297 |
| 6,531,902 | B1 * | 3/2003 | Tennen et al. | 327/108 |
| 6,580,286 | B1 * | 6/2003 | Tennen | 326/30 |
| 6,621,346 | B1 | 9/2003 | Nabicht et al. | |
| 7,649,948 | B2 | 1/2010 | Hauptmann et al. | |
| 2004/0013263 | A1 * | 1/2004 | Maclean et al. | 379/387.01 |
| 2004/0051389 | A1 * | 3/2004 | Verbist et al. | 307/80 |
| 2006/0034359 | A1 | 2/2006 | Hauptmann et al. | |

OTHER PUBLICATIONS

German Office Action for DE 10 2004 039 022.3-31 dated May 3, 2005.

* cited by examiner

*Primary Examiner* — Kenneth Lam
(74) *Attorney, Agent, or Firm* — SpryIP, LLC

(57) ABSTRACT

An electric circuit for amplifying an xDSL signal comprises an operational amplifier and a signal monitoring circuit. The operational amplifier is configured to amplify the xDSL signal, is powered by a variable voltage supply and has a gain which is adjustable by an operating mode control signal. The signal monitoring circuit is activated by the operating mode control signal and is configured, when activated by the operating mode control signal, to generate a control signal to adjust the voltage of the variable voltage supply in order to adjust the maximal signal swing of the output signal of said operational amplifier. The control signal is generated by comparing the amplitude of the xDSL signal applied to the electric circuit with an amplitude threshold value.

18 Claims, 5 Drawing Sheets

ADSL operating mode

VDSL operating mode

ADSL operating mode

VDSL operating mode

XDSL MULTISTANDARD DRIVER CIRCUIT

RELATED APPLICATION

This application is a continuation patent application which claims the benefit of the filing date of U.S. patent application Ser. No. 11/199,637, filed Aug. 9, 2005, now U.S. Pat. No. 7,649,948 the disclosure of which is incorporated herein by reference in its entirety.

BACKGROUND OF THE INVENTION

1. Field of the Invention

The invention relates to an electric circuit configured to drive different xDSL signals, particularly ADSL and VDSL signals.

2. Description of the Prior Art

Various DSL (Digital Subscriber Line) standards have been developed in recent years. Examples of well known DSL standards are ADSL (Asymmetric Digital Subscriber Line), HDSL (High Bit Rate Digital Subscriber Line), IDSL (ISDN Digital Subscriber Line), MDSL (Medium Bit Rate Digital Subscriber Line), RDSL (Rate Adaptive ADSL), RADSL (Reverse ADSL), SDSL (Symmetric Digital Subscriber Line) and VDSL (Very High Speed Digital Subscriber Line).

Different DSL standards have different upstream and downstream data rates. Some DSL standards, for instance, ADSL, MDSL, SDSL and VDSL are used in combination with a conventional telephone service (POTS), while other DSL standards are not compatible with POTS, such as HDSL and IDSL. The xDSL standard which has been used most widely is the ADSL standard, which has different data transmission rates for the data streams flowing to the user (downstream) and for the data streams leaving the user (upstream). The ADSL standard is, therefore, also called asymmetric. For ADSL, data transmission rates are typically about ten times as high downstream, i.e. toward the user, as upstream, i.e. toward the service provider. For ADSL, the downstream data transmission rates are typically between 1 and 8 Mbps, while the upstream data transmission rates are between 100 and 800 kbps. The data transmission rates of VDSL are much greater and reach, for instance, 25 Mbps in both data transmission directions.

In the case of ADSL, digital multitone (DMT) modulated signals are transmitted in a relatively narrow frequency band with a frequency bandwidth of approximately 2 MHz. By contrast, the data transmission of VDSL takes place in a relatively wide frequency band with a frequency bandwidth of up to 30 MHz.

FIG. 1 shows an xDSL driver circuit based on the prior art. The xDSL driver circuit has a signal input for applying an xDSL signal which comes from an analogue front end (AFE). The applied xDSL signal is applied to the inputs of an operational amplifier OP via decoupling capacitors C1 and input resistors R1. The operational amplifier OP, which is a fully differential design in this exemplary embodiment, has two signal outputs which are each fed back via a feedback resistor R2 to the corresponding input of the operational amplifier OP. In addition, the outputs of the operational amplifier OP are coupled to primary windings L1 of a transformer TR via an output resistor R4. The transformer TR has secondary windings L2, with the ratio of the primary to the secondary windings resulting in a transformer ratio Ü. The transformer TR decouples a DC component from the output signal. A capacitor C2 is connected in series to the secondary windings L2, forming a high-pass filter for decoupling the POTS telephone signals from the data signals.

The outputs of the operational amplifier OP are also coupled crosswise via resistors R3 to the inputs of the operational amplifier OP. The resistors R3 are used for positive feedback in order to produce a synthesized output impedance for the driver circuit.

The output impedance $Z_A'$ on the primary side of the transformer TR is obtained from the product of a synthesis factor, m, and the output resistor R4:

$$Z_A' = m\, 2R4.$$

The value of the feedback resistors R3 determines the synthesis impedance factor, m. The ratio of the resistor R2 to the resistance value of the input resistor R1 determines the signal gain or the gain G of the operational amplifier OP:

$$G = R2/R1.$$

As the transformer ratio Ü increases, the supply voltage $V_{DD}$ required for the operational amplifier OP decreases. With an increasing transformer ratio Ü, however, the operational amplifier OP or line driver has to deliver a higher output current I in order to achieve the output power determined by the standard on the line.

The length of the signal or telephone lines between the xDSL driver circuit at the central station (central office) and the driver circuit at the user (customer premises) varies between different xDSL standards. Accordingly, the power P to be transmitted is likewise different for different xDSL standards. By way of example, the power P which is to be output onto the line is 20 dBm for ADSL 2+ and 14.5 dBm for VDSL. As mentioned before, for ASDL 2 the data are transmitted in a relatively narrow frequency band. For ADSL 2, the frequency bandwidth is 2.2 MHz. In this context, the data are transmitted in two separate subfrequency bands, with the first subfrequency band being provided for the data transmitted to the user (downstream) and the second subfrequency band being provided for the data transmitted from the user to the central station (upstream). A relatively small number of subfrequency bands or the small frequency bandwidth means that the risk of crosstalk in ADSL systems is relatively low. By contrast, for VDSL the data are transmitted in a relatively wide frequency band. VDSL1, for example, has a frequency bandwidth of 12 MHz and VDSL2, for instance, has a frequency bandwidth of 17 MHz. In this case, preferably three subfrequency bands are provided for the downstream data transmission direction and three subfrequency bands are provided for the upstream data transmission direction. The relative large transmission frequency bandwidth means that the risk of crosstalk is greater in VDSL systems than in ADSL systems.

In order to avoid the risk of crosstalk, the signals output by the VDSL driver circuit in a VDSL system are therefore transmitted at a lower power level than in ADSL systems. For VDSL, the prescribed maximum power level is 14.5 dBm, whereas in ADSL systems a maximum power level with the line of up to 20 dBm is admissible. The different signal powers mean that the voltage signal swing in the signal, which is output by the operational amplifier, is also different in different xDSL standards. The signal swing at the output of the operational amplifier is mainly determined by the supply voltage $V_{DD}$ applied to the operational amplifier. For ADSL systems, the supply voltage for the operational amplifier is 20 V, and for VDSL systems a typical VDSL driver circuit has a supply voltage of approximately 12 V.

The synthesized output impedance using the positive feedback resistors R3 minimizes the signal swing at the output of the operational amplifier and the latter's power consumption. As the frequency bandwidth for data transmission increases, the distortion caused by the operational amplifier increases due to the decreasing loop gain. Consequently, the synthesis factor, m, has an upper limit. The synthesis factor, m, in typical ADSL driver circuits is 5 to 6, whereas the synthesis factor in VDSL driver circuits is 3. The higher the transmission frequency bandwidth, the lower the admissible synthesis factor, m.

The signal swing at the output of the operational amplifier, for instance, is 17 Vp for an ADSL driver circuit at a supply voltage $V_{DD}$=20 V, at a synthesis factor, m, of 6 and at a maximum permissible output power P of 20 dBm. By contrast, the maximum signal swing of the output of the operational amplifier for a VDSL driver circuit at a supply voltage of 12 V and a synthesis factor, m, 3 is 10 Vp, i.e. 10 V peak to peak.

The xDSL driver circuit based on prior art and being shown in FIG. 1 is thus configured in accordance to the xDSL standard. The table below shows the most important data for configuring xDSL driver circuits based on the prior art for the ADSL standard and the VDSL standard.

TABLE

|  | ADSL | VDSL |
| --- | --- | --- |
| Supply voltage $V_{DD}$ | 20 V | 12 V |
| Transmission power P | 20 dBm | 14.5 dBm |
| Output resistor R4 | ~5 Ω | ~10 Ω |
| Synthesis factor m | 5-6 | ~3 |
| Gain G = $\frac{R2}{R1}$ | ~16 | ~11 |
| Transformer ratio Ü | 1.3 | 1.3 |

A drawback of prior art xDSL driver circuits as shown in FIG. 1 is that different xDSL driver circuits need to be provided, depending on which type of xDSL signals are being transmitted. If a user wishes to change from ADSL to VDSL, for example, then the ADSL driver circuit needs to be replaced by a VDSL driver circuit, i.e. the hardware needs to be replaced. If the user wishes to return to the ADSL standard, then the VDSL driver circuit needs to be replaced by an ADSL driver circuit again, i.e. the boards are swapped again. This is naturally very laborious for the user. The xDSL driver circuit based on the prior art, as shown in FIG. 1, provides no kind of flexibility for the xDSL signal applied.

SUMMARY OF THE INVENTION

It is an object of the present invention to provide an xDSL multistandard driver circuit which can be used in different xDSL standard settings.

The object is achieved in accordance with the invention by means of an electric circuit for amplifying an xDSL signal which is applied to an input of the electric circuit. The electric circuit is configured to be adjusted to different xDSL settings according to an operating mode control signal. The electric circuit is comprised of an operational amplifier and a signal monitoring circuit. The operational amplifier is configured to amplify the xDSL signal applied to the electric circuit. The operational amplifier is powered by a variable voltage supply and has a gain which is adjustable by the operating mode control signal. The signal monitoring circuit is activated by the operating mode control signal and is configured, when activated by the operating mode control signal, to generate a control signal to adjust the voltage of the variable voltage supply in order to adjust the maximal signal swing of the output signal of said operational amplifier. The control signal is generated by comparing the amplitude of the xDSL signal applied to the electric circuit with an amplitude threshold value.

An advantage of the inventive xDSL multistandard driver circuit is that it can be programmed for different settings. By appropriately programming a software, it is possible to use the same xDSL driver circuit, i.e. the corresponding hardware, for using different xDSL standards, with only the programming changing.

In a restricted version of the inventive xDSL multistandard driver circuit, the signal monitoring circuit which is activated by the operating mode control signal increases the supply voltage for the operational amplifier on a signal-dependent basis if the signal amplitude of the applied xDSL signal exceeds the amplitude threshold value (class H mode).

In another restricted version of the inventive xDSL multistandard driver circuit, the signal monitoring circuit which is activated by the operating mode control signal adjusts a supply voltage connection of the operational amplifier from a low supply voltage to a high supply voltage if the signal amplitude of the applied xDSL signal exceeds the amplitude threshold value which has been set (class G mode).

The signal monitoring circuit may comprises a comparator.

In a further restricted version of the inventive xDSL multistandard driver circuit, the xDSL signal to be driven is applied to an input of the xDSL multistandard driver circuit. The inventive xDSL multistandard driver circuit is connected via at least one decoupling capacitor to an input of the signal monitoring circuit.

The amplitude threshold value may be adjustable.

Preferably, a first resistor may be provided between the coupling capacitor and the input of the operational amplifier.

The output of the operational amplifier may be connected via an output resistor to a primary windings of a transformer. The secondary windings of the transformer may be connected in series with a capacitor.

In a further restricted version of the inventive xDSL multistandard driver circuit, the secondary windings of the transformer and the capacitor connected in series therewith are connected to a signal output of the xDSL multistandard driver circuit.

In another restricted version of the inventive xDSL multistandard driver circuit, the feedback resistors can be changed over using a first switching device which is actuated by the operating mode control signal.

The supply voltages for the operational amplifier may be adjusted using a second switching device which is controlled by the control signal from the activated comparator.

The resistance values of the feedback resistors may be programmable.

In a further restricted version of the inventive xDSL multistandard driver circuit, the output resistor is fed back to the input of the operational amplifier via a further feedback resistor in order to produce a synthesized output impedance.

The operational amplifier may be a class G power amplifier.

The driver circuit may be of fully differential design.

In a further restricted version of the inventive xDSL multistandard driver circuit, the operating mode control signal is generated by a control circuit which determines the xDSL standard which is to be set from a training signal sequence for the xDSL signal which is to be amplified.

The driver circuit may be adjusted to an ADSL standard setting and to a VDSL standard setting on the basis of the operating mode control signal.

The driver circuit may also be adjusted between an ADSL standard setting, a VDSL standard setting, an SHDSL standard setting and an HDSL standard setting on the basis of the operating mode control signal.

DESCRIPTION OF THE PREFERRED EMBODIMENTS

Figure 1:
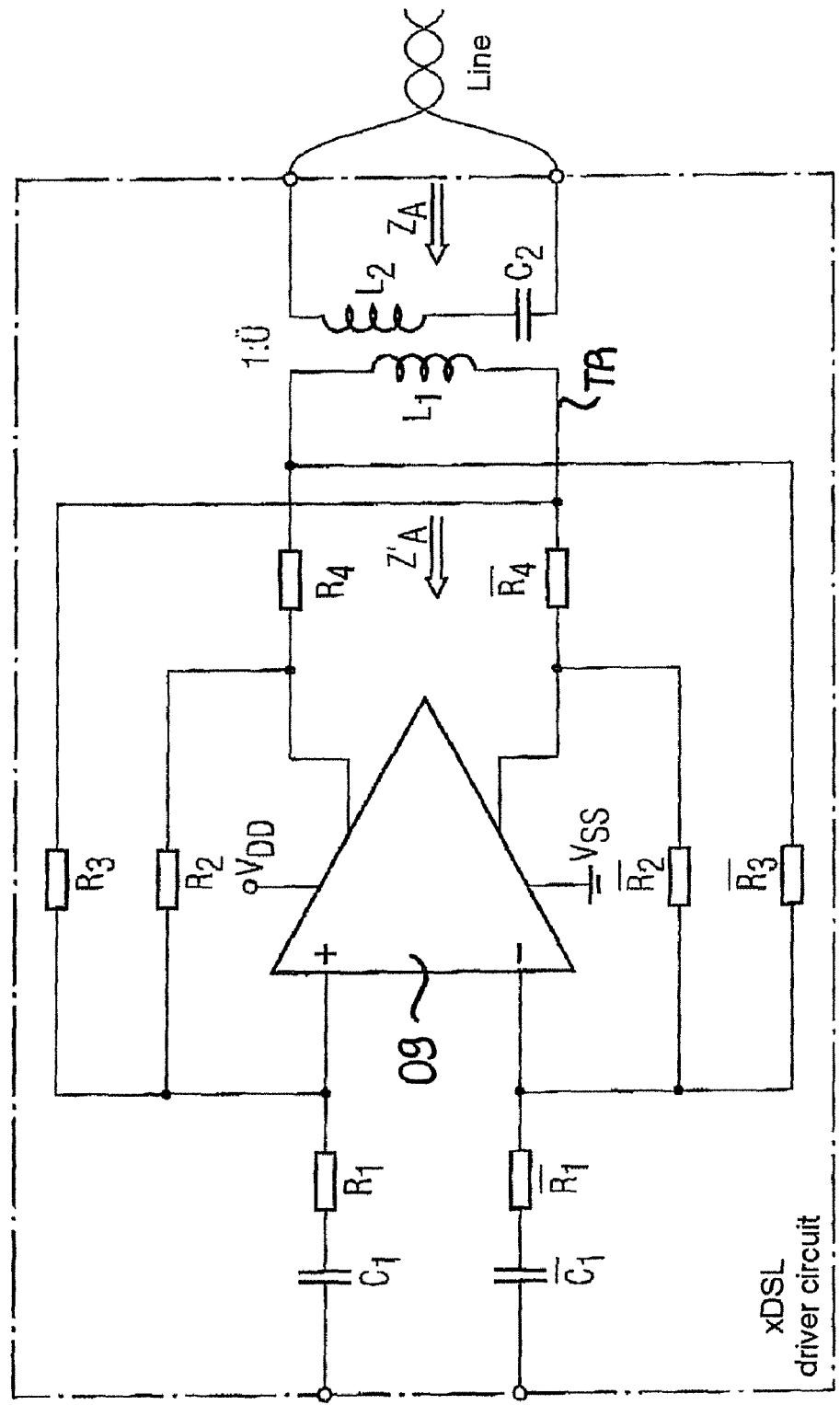
FIG. 1, as discussed above, is an xDSL driver circuit diagram according to prior art.
Figure 2:
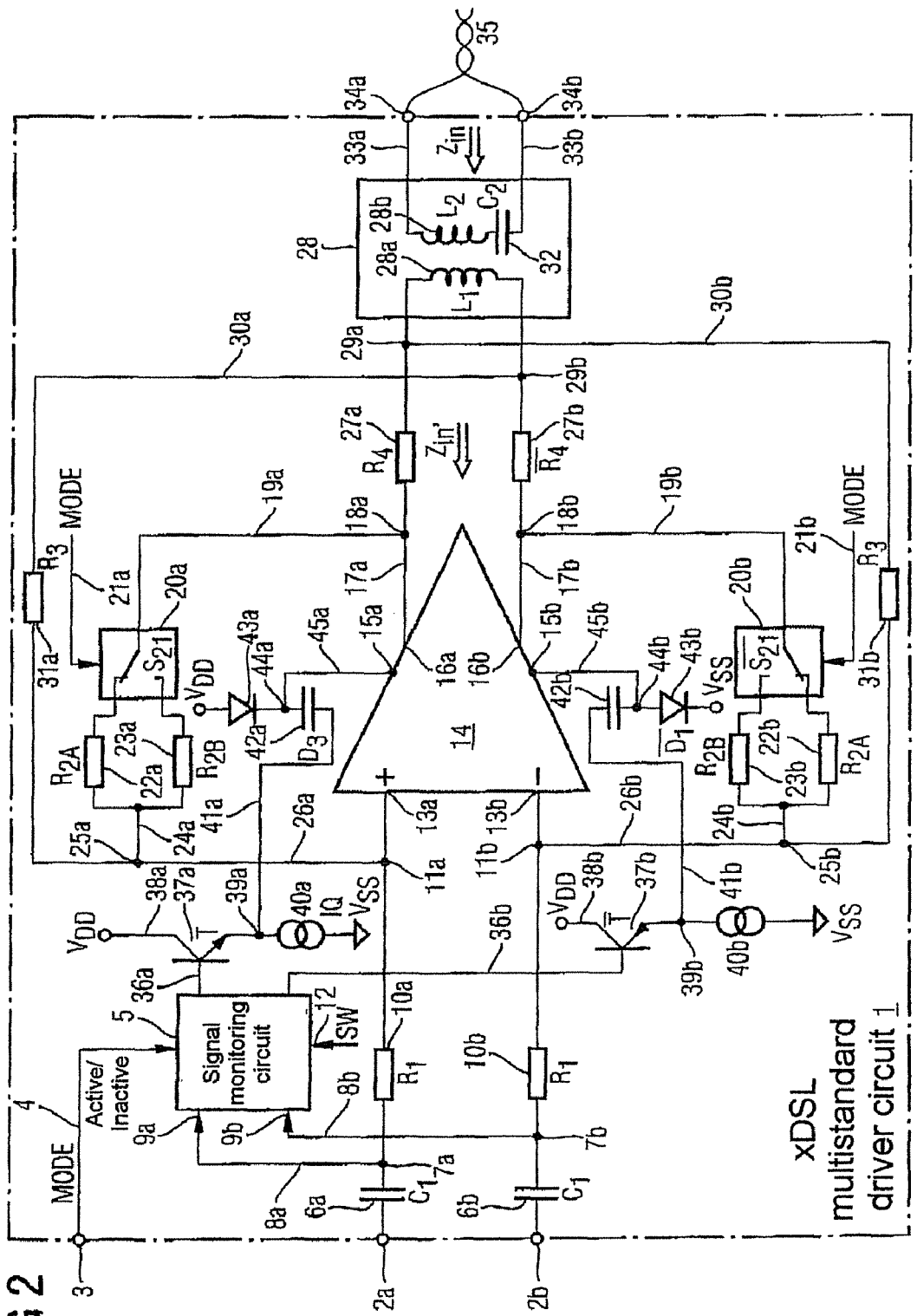
FIG. 2 is a first xDSL multistandard driver circuit diagram of a first xDSL multistandard driver circuit.

FIG. 2 shows a circuit diagram of an xDSL multistandard driver circuit 1 as a first exemplary embodiment. The xDSL multistandard driver circuit 1 is provided for driving an xDSL signal which is applied to an input 2a, and a signal input 2b of the xDSL multistandard driver circuit 1. The xDSL multistandard driver circuit 1 has a control input 3 to which an external operating mode control signal (MODE) is applied. The control connection 3 is connected to a signal monitoring circuit 5 via an internal control line 4, with the signal monitoring circuit 5 being activated or deactivated depending on the operating mode control signal. The signal monitoring circuit 5 monitors the signal amplitude at the inputs 2a, 2b of the xDSL multistandard driver circuit 1. The signal inputs 2a, 2b of the driver circuit 1 are connected to nodes 7a, 7b via decoupling capacitors 6a, 6b. The nodes 7a, 7b are connected firstly via lines 8a, 8b to signal inputs 9a, 9b of the signal monitoring circuit 5 and secondly via input resistors 10a, 10b to nodes 11a, 11b. The signal monitoring circuit 5 may also have a further control input 12 for setting an amplitude threshold value SW.

For this exemplary embodiment, the nodes 11a, 11b are connected to the non-inverting input 13a and to the inverting input 13b, respectively, of an operational amplifier 14. The operational amplifier 14 is of fully differential design for this example. In the embodiment shown in FIG. 2, the operational amplifier 14 has two supply voltage connections 15a, 15b. In addition, the operational amplifier 14 has two outputs 16a, 16b which are connected to branching nodes 18a, 18b via output lines 17a, 17b. At the branching nodes 18a, 18b, the output signal from the operational amplifier 14 is fed back to switching devices 20a, 20b via lines 19a, 19b. The switching devices 20a, 20b are controlled via control lines 21a, 21b, which are connected to the control input 3 of the driver circuit 1, on the basis of the applied operating mode control signal (MODE). At least two parallel-connected feedback resistors 22a, 23a or 22b, 23b are connected to the two outputs of the switching devices 20a, 20b. The parallel-connected feedback resistors are connected to nodes 25a, 25b via lines 24a, 24b. The lines 26a, 26b connect the nodes 11 and the nodes 25. By means of the first switching devices 20a, 20b and the parallel-connected feedback resistors 22, 23, an internal feedback loop is provided between the outputs 16a and 16b and the signal inputs 13a and 13b of the operational amplifier 14. In the present exemplary embodiment, depending on the operating mode control signal (MODE), the switching devices 20a, 20b connect the feedback resistors 22a and 22a or the resistors 23a and 22b to the circuit 1 in order to set the signal gain G of the operational amplifier 14.

The signal gain G of the operational amplifier 14 is dependent on the ratio of the feedback resistors to the resistance value of the input resistor 10. On the basis of the operating mode of the control signal it is thus possible to adjust the gain G of the operational amplifier 14.

The output nodes 18a, 18b of the operational amplifier 14 are connected to a primary inductance 28a of a transformer 28 via output resistors 27a, 27b. The output nodes 29a, 29b of the primary inductance are connected crosswise via feedback lines 30a, 30b to feedback resistors 31a, 31b. The crosswise negative feedback or positive feedback determines the synthesis factor, m, for the synthesized output impedance using the resistors 31.

The transformer 28 has a secondary inductance 28b which is connected in series with a capacitor 32. The secondary inductance 28b and the series-connected capacitor 32 are connected to signal output connections 34a, 34b of the xDSL multistandard driver circuit 1 via lines 33a, 33b. The preferably twisted signal line or telephone line 35 is connected at the output 34 of the driver circuit 1.

In the present exemplary embodiment, the operational amplifier 14 is operated in a class H mode, i.e. the supply voltage which is applied to the supply voltage connections 15a, 15b of the operational amplifier 14 is tracked to the signal profile of the applied xDSL signal. For this, the signal monitoring circuit 5 uses control lines 36a, 36b to actuate transistors 37a, 37b of complementary design whose collector connections 38a, 38b are connected to the positive supply voltage $V_{DD}$. The emitter connections of the transistors 37a, 37b are connected to nodes 39a, 39b which are connected to a negative supply voltage $V_{SS}$ via current sources 40a, 40b. Capacitors 42a, 42b are also connected to the nodes 39a, 39b via lines 41a, 41b, said capacitors being connected to the positive or negative supply voltage via diodes 43a, 43b. Between the capacitors 42 and the diodes 43, there is a respective branch node 44a, 44b which is connected via lines 45a, 45b to the supply voltage connections 15a, 15b of the operational amplifier 14.

FIG. 2 illustrates the operation of the xDSL multistandard driver circuit 1. In the present exemplary embodiment, the xDSL multistandard driver circuit 1 can preferably be switched between an ADSL standard setting and a VDSL standard setting. The xDSL multistandard driver circuit 1 is adapted to the appropriate setting using a control connection 3. In the VDSL mode of operation, the signal monitoring circuit 5 is deactivated via the control line 4. Due to the deactivated signal monitoring circuit 5, the complementary transistors 37a, 37b are turned off via the control lines 36a, 36b. The current sources 40a, 40b are used to charge the capacitors in the deactivated state of the signal monitoring circuit 5, corresponding to the VDSL mode of operation. If the positive supply voltage $V_{DD}$ is, for instance, +6 V and the negative supply voltage $V_{SS}$ is −6 V, then the capacitor 42a is charged to +6 V by the current source 40a and the complementary capacitor 44b is charged to −6 V in the VDSL mode of operation, corresponding to the signal monitoring circuit 5 being deactivated. In the VDSL mode of operation, the operational amplifier 14 also receives the supply voltage via the diodes 43a and 43b. The supply voltage connections 15a, 15b receive the supply voltage respectively reduced by the forward voltage of the diodes 43a, 43b. If the positive supply voltage is, for instance, +6 V and the negative supply voltage Vs is −6 V, then the positive supply voltage connection 15a of the operational amplifier has a voltage of +5.4 V applied to it and the negative supply voltage connection 15b has a voltage of −5.4 V applied to it, assuming a forward voltage for the diode of 0.6 V. In the present exemplary embodiment, the maximum signal voltage swing at the output 16a, 16b of the operational amplifier 14 is 2 5.4 V, i.e. 10.8 V.

Figure 3A:
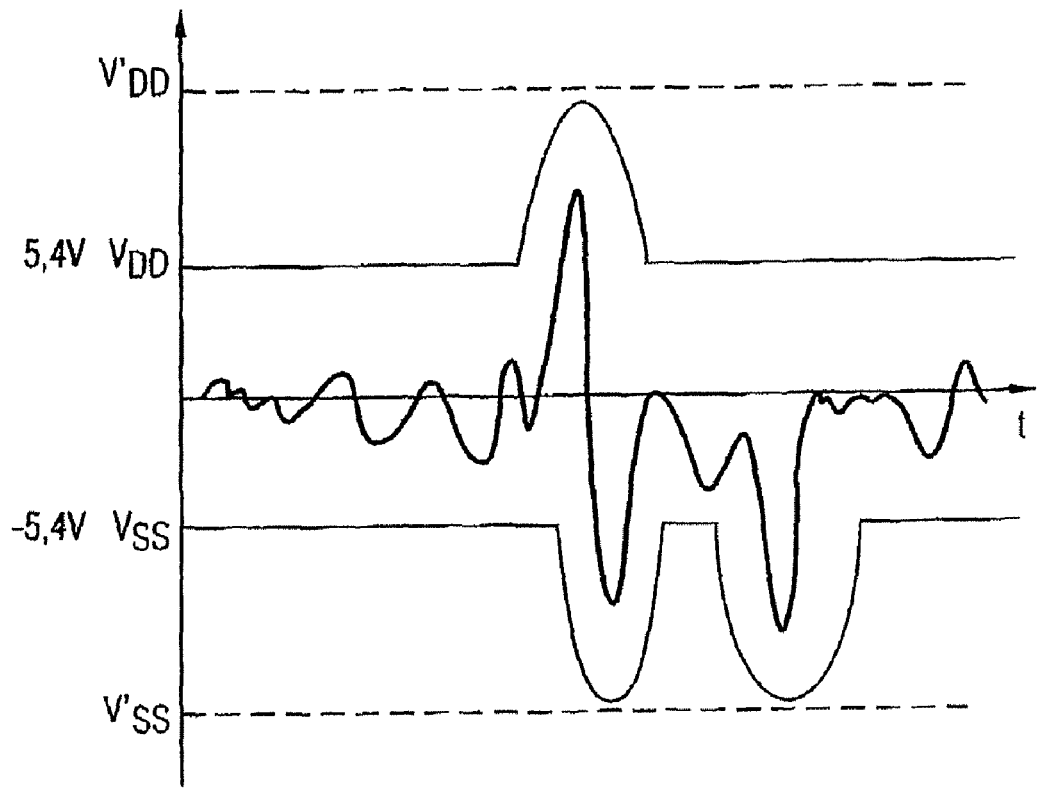
FIGS. 3a and 3b are signal diagrams illustrating the operation of the first xDSL multistandard driver circuit.
Figure 3B:
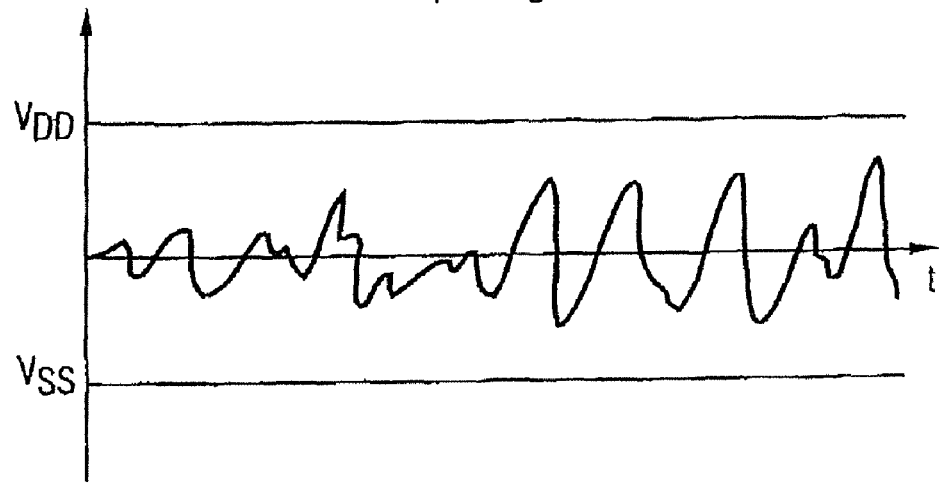

Since in the VDSL mode of operation the signal monitoring circuit 5 is deactivated, the voltages of the supply voltage connections 15a, 15b of the operational amplifier 14 are constant, for instance, ±5.4 V. FIG. 3b shows an output signal from the operational amplifier 14 for the VDSL mode of operation. The value of the output signal is between the two constant supply voltages. A supply voltage difference of 10.8 V is sufficient in the VDSL mode, because the applied VDSL signal has a relatively small signal amplitude. In the VDSL mode of operation, the switching device 20 is also used to connect the feedback resistor for the VDSL mode of operation, so that a gain G of, for instance, 16 is obtained. The synthesis factor, m, determined by the feedback resistors 31a, 31b is preferably set to the maximum value of 3 prescribed by the VDSL standard. The resistance values of the feedback resistors 31a, 31b may likewise be programmable.

The xDSL multistandard driver circuit 1 shown in FIG. 2 can be adjusted from the VDSL mode of operation to the ADSL mode of operation and from the ADSL mode of operation to the VDSL mode of operation, by means of the operating mode control signal (MODE). For this, the xDSL multistandard driver circuit 1 may comprise an additional control circuit which determines the appropriate xDSL standard from a training signal sequence for the applied xDSL signal and adjusts the xDSL multistandard driver circuit appropriately.

If the xDSL multistandard driver circuit 1 is adjusted from the VDSL mode of operation to the ADSL mode of operation, the control line 4 is used to activate the signal monitoring circuit 5. The signal monitoring circuit 5 increases the supply voltage for the operational amplifier 14 if the signal amplitude of the applied xDSL signal exceeds a particular adjustable amplitude threshold value SW. This threshold value SW is preferably set using a control input 12. The signal monitoring circuit 5 activated in the ADSL mode turns on the complementary transistors 37a, 37b via the control lines 36a, 36b when the threshold value SW is exceeded.

As soon as the transistors 37a, 37b have been turned on, the potential nodes 39a, 39b are at the positive supply voltage potential $V_{DD}$ and at the negative supply voltage potential $V_{SS}$, respectively. This raises or lowers the voltage potential at the nodes 44a, 44b by the positive supply voltage $V_{DD}$ and the negative supply voltage $V_{SS}$, respectively. The voltage at the voltage node 44a thus rises from 5.4 V to 11.4 V when the transistor 37a is turned on by the signal monitoring circuit 5. In the same way, the voltage at the node 44b changes abruptly from −5.4 V to −11.4 V when the transistor 37b is turned on by the signal monitoring circuit 5. Thus, if a high signal amplitude for the applied xDSL signal which is to be amplified appears at the signal input 2 of the xDSL multistandard driver circuit 1, then the signal monitoring circuit 5 increases the supply voltages for the operational amplifier 14 which are applied to the supply voltage connections 15a, 15b. If a signal peak appears in the applied ADSL signal, the supply voltage is readjusted accordingly, as shown in FIG. 3a. The operational amplifier 14 operates in a class H mode. When a signal peak appears, then the capacitors 42a, 42b supply the necessary current only for a relatively short time, which is sufficient, however, to prevent the signal peak from being distorted. The signal monitoring circuit 5 recognizes when the signal peak has passed, and thus the transistors 37a, 37b are turned off again and the capacitors 42a, 42b charge again in order to be ready for the next signal peak.

In the VDSL mode of operation, the signal monitoring circuit 5 is always deactivated. A low supply voltage $V_{DD}$ is sufficient in the VDSL mode of operation, because less power is needed to be output onto the telephone line 35. Since the signal is transmitted with a larger signal bandwidth in an VDSL mode of operation, it is advantageous to the performance that the supply voltage is not switched in the VDSL mode of operation.

The signal gain G, which is determined by the resistance values of the VDSL feedback resistors 22a, is dimensioned so that the signal swing at the output of the operational amplifier 14 does not go beyond the relatively low supply voltage $V_{DD}$-$V_{SS}$ in the VDSL mode of operation. There is therefore no need for any changeover or readjustment of the supply voltage in the VDSL mode of operation. In this case, the operational amplifier 14 advantageously operates in a highly linear class AB mode.

In the present exemplary embodiment, the xDSL multistandard driver circuit 1 is configured to switch between different xDSL standards by firstly adjusting the supply voltage for the operational amplifier 14 by means of the signal monitoring circuit 5 and secondly adjusting the signal gain by means of the switching devices 20a, 20b. The signal gain may be approximately 16 in the ADSL mode of operation and approximately 10 in the VDSL mode of operation. The synthesis impedance factor, m, is obtained from the ratio of the terminating impedance $Z_{in}'$ and the output resistance 27a, 27b:

$$m = \frac{Z'_{in}}{2 \cdot R_{27}}$$

The synthesis impedance factor, m, is preferably set to 3. In the present exemplary embodiment illustrated by FIG. 2, the transformer ratio Ü of the transformer 28 is 1.5, which means that a terminating impedance $Z_{in}'$ of approximately 44Ω is obtained for a terminating impedance of 100Ω at the output connection 34.

With a synthesis impedance factor, m, of 3, the output impedance 27a is preferably dimensioned at 14Ω.

Figure 4:
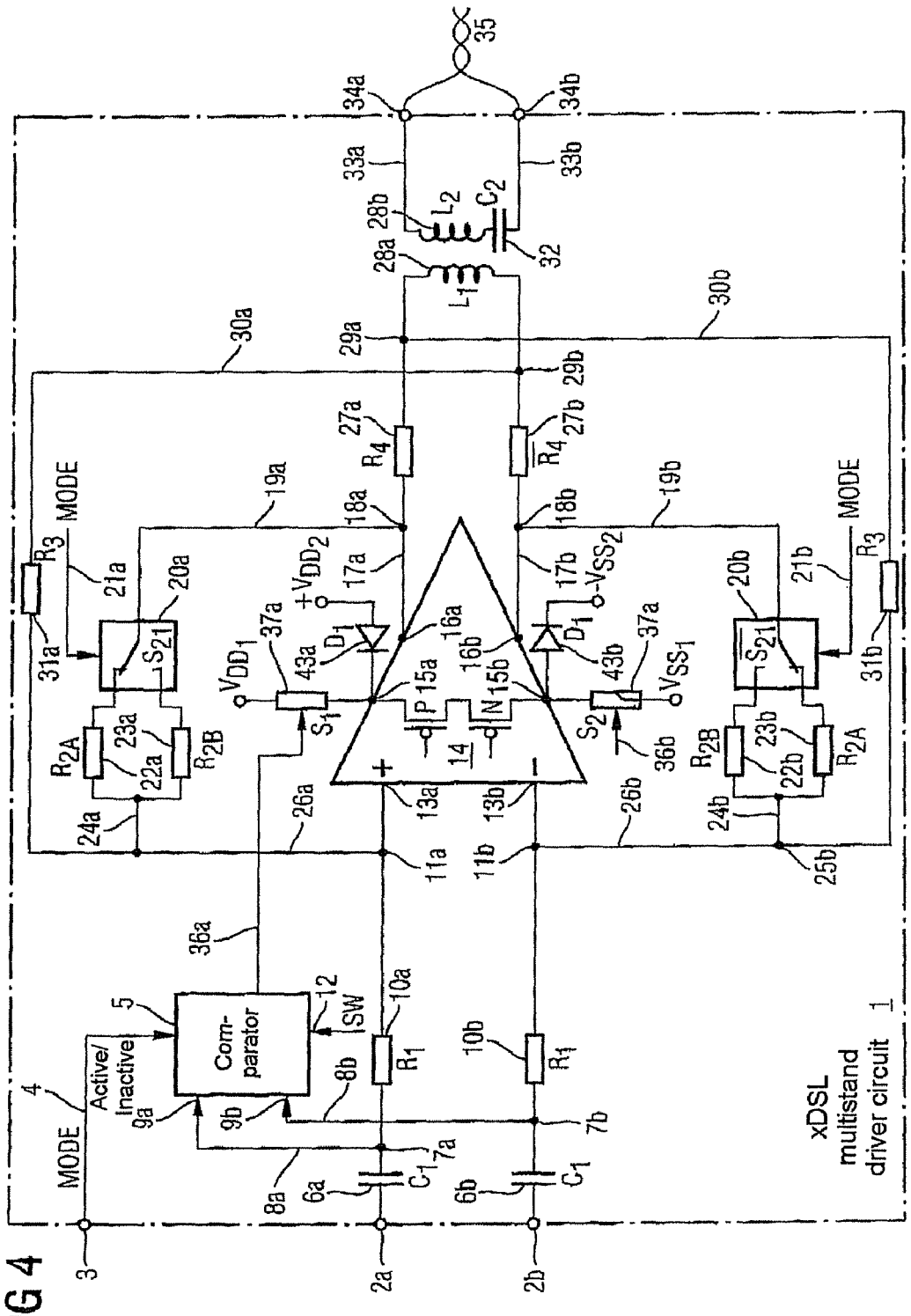
FIG. 4 is a second xDSL multistandard driver circuit diagram of a second xDSL multistandard driver circuit.

FIG. 4 shows a circuit diagram of an alternative exemplary embodiment of an xDSL multistandard driver circuit 1'.

For the xDSL multistandard driver circuit 1' whose circuit diagram is depicted in FIG. 4, the signal monitoring circuit is formed by a single comparator 5'. The signal monitoring circuit, i.e. the comparator 5 is deactivated in the VDSL mode of operation and is activated in the ADSL mode of operation. In the VDSL mode of operation, the comparator 5 uses the control lines 36a, 36b to open the switching devices 37a, 37b, which are preferably transistors, as in the first exemplary embodiment illustrated in FIG. 2. In the VDSL mode of operation, the operational amplifier is thus supplied with relatively low first supply voltages +$V_{DD2}$, −$V_{SS2}$ via the diodes 43a, 43b.

In the present exemplary embodiment shown in FIG. 4, the diodes 43a, 43b are not integrated in the operational amplifier 14. The diodes 43a, 43b may, however, be integrated within the operational amplifier 14 as well.

If the operating mode control signal is used to adjust the driver circuit 1' from the VDSL mode of operation to the ADSL mode of operation, then the comparator 5' is activated and monitors the value of the xDSL input signal. As soon as a signal peak appears therein, the switches 37a, 37b are turned on, so that a relatively high supply voltage $V_{DD1}$, $V_{SS1}$ is applied to the supply voltage connections 15a, 15b of the operational amplifier 14.

In the present exemplary embodiment shown in FIG. 4, two different supply voltages therefore are necessary, namely the high supply voltage $V_{DD1}$-$V_{SS1}$ and the low supply voltage $V_{DD2}$-$V_{SS2}$. In the present exemplary embodiment shown in FIG. 4, the operational amplifier 14 is adjusted between a low supply voltage, for instance, ±6 V, and a high supply voltage, for instance, ±12 V in the ADSL mode of operation on the basis of the signal value of the xDSL input signal.

Figure 5A:
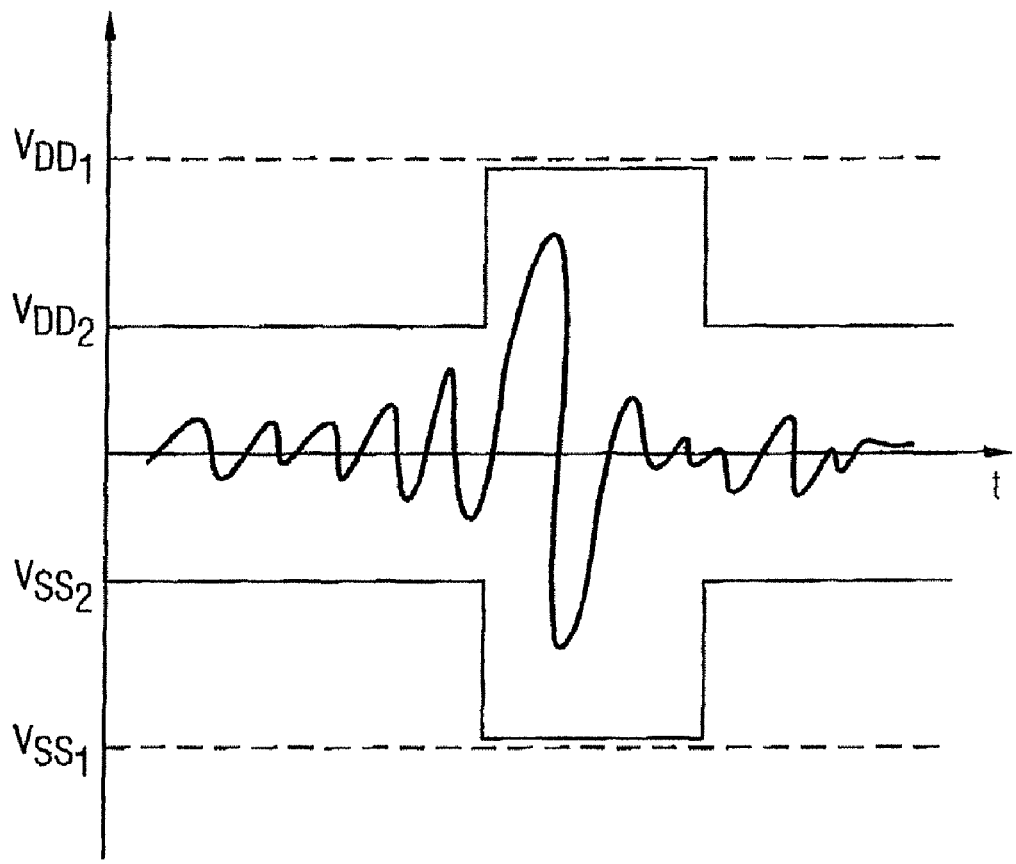
FIGS. 5a and 5b are signal diagrams illustrating the operation of the second xDSL multistandard driver circuit.
Figure 5B:
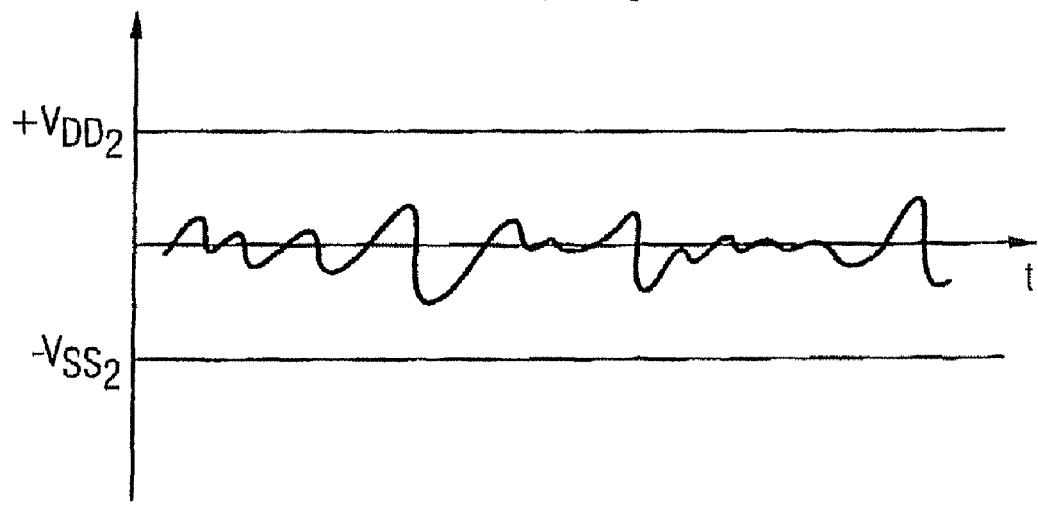

FIGS. 5a and 5b show the signal profiles at the output of the operational amplifier 14 for the two modes of operation. In the VDSL mode of operation, the signal amplitude moves between the two constant supply voltages $V_{DD2}$, $V_{SS2}$, when neglecting the forward voltage drop of the diodes 43a, 43b. In the ADSL mode of operation, as soon as the comparator 5' detects a signal peak, the supply voltage is adjusted to the high supply voltage $V_{DD1-SS1}$. When adjusting from the ADSL mode of operation to the VDSL mode of operation or vice-versa, the switching devices 20a, 20b are also used to adjust the feedback resistors 22, 23 in order to set the signal gain factor G.

In the present exemplary embodiment shown in FIG. 4, the operational amplifier 14 operates in a "class G mode". The demodulated xDSL signal has a very high crest factor by nature, both in the VDSL mode of operation and in the ADSL mode of operation, so that high signal amplitudes arise only relatively rarely. Only for these signal peaks is it necessary to adjust to the higher supply voltage, as shown in FIG. 5a. In the ADSL mode of operation, the high supply voltage $V_{DD1}$ $V_{SS1}$ is thus applied only relatively rarely to the supply voltage connections 15a, 15b of the operational amplifier 14. On account of the normally low supply voltage $V_{DD2}$-$V_{SS2}$, the power consumption of the operational amplifier 14 is therefore relatively low. In the VDSL mode, the operational amplifier 14 operates at the low supply voltage $V_{DD2}$, $V_{SS2}$ in all cases.

The invention claimed is:

1. An xDSL multistandard driver circuit for amplifying an xDSL signal which is applied to an input of said xDSL multistandard driver circuit; said xDSL multistandard driver circuit being configured to be adjusted to different xDSL settings of different xDSL standards according to an operating mode control signal and comprising:
    an operational amplifier configured to amplify said xDSL signal applied to said xDSL multistandard driver circuit; said operational amplifier being powered by a variable voltage supply,
    a signal monitoring circuit which is activated by said operating mode control signal; said signal monitoring circuit being configured, when activated by said operating mode control signal, to generate a control signal to adjust the voltage of said variable voltage supply in order to adjust the maximal signal swing of the output signal of said operational amplifier; said control signal being generated by comparing the amplitude of said xDSL signal with an amplitude threshold value, wherein a signal gain for amplifying said xDSL signal is adjusted on the basis of an operating mode of said operating mode control signal,
    at least one impedance and a first switching device which is controlled by said operating mode control signal; said switching device being configured to connect the at least one impedance between the output and the input of said operational amplifier dependent on said operating mode control signal to adjust said gain of said operational amplifier.

2. The circuit of claim 1, wherein said control signal adjusts the voltage of said variable voltage supply to a higher voltage value, if said amplitude of said xDSL signal applied to said xDSL multistandard driver circuit exceeds the amplitude threshold value.

3. The circuit of claim 1, wherein said monitoring circuit comprises a comparator.

4. The circuit of claim 1, wherein said input of said xDSL multistandard driver circuit is connected via at least one first capacitor to an input of said signal monitoring circuit.

5. The circuit of claim 4, wherein said xDSL multistandard driver circuit comprises a resistor being connected between said first capacitor and said input of said operational amplifier.

6. The circuit of claim 1, wherein said amplitude threshold value is adjustable.

7. The circuit of claim 1, wherein said xDSL multistandard driver circuit comprises a resistor being connected to an output of said operational amplifier and to primary windings of a transformer.

8. The circuit of claim 7, wherein said transformer has secondary windings which are connected in series which a second capacitor.

9. The circuit of claim 8, wherein said second capacitor is connected to a signal output of said xDSL multistandard driver circuit.

10. The circuit of claim 7, wherein said resistor is fed back to said input of said operational amplifier via another resistor in order to produce a synthesized output impedance.

11. The circuit of claim 1, wherein said xDSL multistandard driver circuit comprises a second switching device being controlled by said control signal to adjust the voltage of said variable voltage supply.

12. The circuit of claim 1, wherein the at least one impedance is programmable.

13. The circuit of claim 1, wherein said operational amplifier is a class G power amplifier.

14. The circuit of claim 1, wherein said xDSL multistandard driver circuit is of fully differential design.

15. The circuit of claim 1, further comprising a control circuit which generates said operating mode control signal; said control circuit being configured to determine the appropriate xDSL of said applied xDSL signal based on a training signal sequence.

16. The circuit of claim 1, wherein said xDSL settings are at least two out of the group of xDSL settings consisting of an ADSL, a VDSL, a SHDSL, and an HDSL standard setting.

17. A multistandard driver circuit for amplifying a signal which is applied to an input of said multistandard driver circuit; said multistandard driver circuit being configured to be adjusted to different settings of different standards according to an operating mode control signal and comprising:
    an operational amplifier configured to amplify said signal applied to said multistandard driver circuit; said operational amplifier being powered by a variable voltage supply,
    a signal monitoring circuit which is activated by said operating mode control signal; said signal monitoring circuit being configured, when activated by said operating mode control signal, to generate a control signal to adjust the voltage of said variable voltage supply; said control signal being generated by comparing the amplitude of said signal with an amplitude threshold value, wherein a signal gain for amplifying said signal is adjusted on the basis of an operating mode of said operating mode control signal,
    at least one impedance and a first switching device which is controlled by said operating mode control signal; said switching device being configured to connect the at least one impedance between the output and the input of said operational amplifier dependent on said operating mode control signal to adjust said gain of said operational amplifier.

18. The circuit of claim 17, wherein said operational amplifier has a gain being adjustable by said operating mode control signal.

* * * * *